(12) United States Patent  
Karam (10) Patent No.: US 7,973,538 B2
(45) Date of Patent: Jul. 5, 2011

(54) POWER OVER ETHERNET SYSTEM HAVING HAZARD DETECTION CIRCUITRY TO DETECT POTENTIALLY HAZARDOUS CABLE CONDITIONS

(75) Inventor: Roger Karam, Mountain View, CA (US)

(73) Assignee: Cisco Technology, Inc., San Jose, CA (US)

( * ) Notice: Subject to any disclaimer, the term of this patent is extended or adjusted under 35 U.S.C. 154(b) by 476 days.

(21) Appl. No.: 12/195,803

(22) Filed: Aug. 21, 2008

(65) Prior Publication Data

US 2010/0045302 A1    Feb. 25, 2010

(51) Int. Cl.
    *G01R 31/02*  (2006.01)
(52) U.S. Cl. ........................................................ 324/539
(58) Field of Classification Search .................... 324/539
    See application file for complete search history.

(56) References Cited

U.S. PATENT DOCUMENTS

| | | | |
|---|---|---|---|
| 6,459,275 B1 * | 10/2002 | Ewalt et al. ................... | 324/539 |
| 7,012,436 B1 * | 3/2006 | Pannell et al. ................ | 324/539 |
| 7,154,381 B2 * | 12/2006 | Lang et al. ................ | 340/310.11 |
| 7,417,443 B2 * | 8/2008 | Admon et al. ................ | 324/522 |
| 7,509,114 B2 * | 3/2009 | Berson et al. ................ | 455/402 |
| 7,593,756 B2 * | 9/2009 | Ferentz et al. ................ | 455/572 |
| 2006/0100799 A1 * | 5/2006 | Karam ............................ | 702/57 |
| 2007/0260904 A1 * | 11/2007 | Camagna et al. ............. | 713/310 |
| 2008/0122448 A1 * | 5/2008 | Pischl ............................ | 324/600 |

* cited by examiner

*Primary Examiner* — Timothy J Dole
(74) *Attorney, Agent, or Firm* — BainwoodHuang (57) ABSTRACT

An apparatus includes power circuitry and hazard detection circuitry connectable to a multi-conductor cable. The power circuitry transfers electrical power from a power-sourcing equipment (PSE) to a powered device (PD) over the multi-conductor cable. The hazard detection circuitry senses an electrical characteristic of the multi-conductor cable and generates a detection signal indicating whether a potentially hazardous abnormal operating condition exists in the multi-conductor cable based on the sensed electrical characteristic. Examples include short-circuit detection circuitry which detects a hazard-producing short-circuit connection between sets of conductors that can cause a "stacking" or additive combining of PSE output voltages, and hot-cable detection circuitry detecting the presence of full operating voltage on the cable under abnormal conditions.

47 Claims, 8 Drawing Sheets

POWER OVER ETHERNET SYSTEM HAVING HAZARD DETECTION CIRCUITRY TO DETECT POTENTIALLY HAZARDOUS CABLE CONDITIONS

BACKGROUND

The invention pertains to the field of powered communications interfaces via which DC power is provided to operating circuitry.

Powered communications interfaces are utilized in data communications systems to provide operating power to devices over the same wires used to carry data communications signals, in a manner analogous to the traditional telephone system in which DC operating power is provided to subscriber equipment over the twisted-pair telephone wires. Today, there is widespread use of so-called "power over Ethernet" or POE technology, in which DC operating power is provided to digital telephones, video cameras, and other data terminal equipment over unshielded twisted pair (UTP) cables connecting the data equipment with centralized data switches. In POE parlance, a device receiving power in this fashion is termed a "powered device" or PD, while a device that provides power for use by PDs is termed a "power sourcing equipment" or PSE.

Conventionally, a PSE applies full power (48 volts and a class-based maximum current) to the PD via the powered communication interface as long as the PSE has sufficient incremental power available to do so. The PD uses this POE power to operate. In many cases, the 48 V power is supplied to one or more DC-DC converters in the PD which transform the 48 V power into other specific operating voltages as required by the PD operating circuitry, such as ±15 V, +3.3 V, etc. In particular, the 48 V power is used to provide power to communications circuitry within the PD that effects high-speed data communications to/from the PD over the same twisted pairs used to carry the POE power. This circuitry is commonly referred to by the term PHY, referring to its "physical layer" communications functionality according to the well-known hierarchical description of data network communications.

In some systems a single 4-pair UTP cable may carry POE power from two PSEs to a single PD. The two PSEs may be co-located, or one may be an endpoint device (such as a network switch) and the other an intermediate device such as a midspan power injector. Power from one PSE is supplied to one set of two pairs (e.g., pairs numbered 3,6 and 1,2), while power from the other PSE is supplied to another set of two pairs (e.g., pairs numbered 4,5 and 7,8). The PD may use the two sets of power signals to power two separate loads or a single load by using appropriate circuitry, including protection circuitry to prevent a direct PSE-to-PSE connection from being made within the PD.

BRIEF DESCRIPTION OF THE DRAWINGS

Objects, features and advantages will be apparent from the following description of particular embodiments of the invention, as illustrated in the accompanying drawings in which like reference characters refer to the same parts throughout the different views. The drawings are not necessarily to scale, emphasis instead being placed upon illustrating the principles of various embodiments of the invention.

DETAILED DESCRIPTION

Overview

In power-over-Ethernet (POE) systems employing multiple PSEs providing power to an interconnect component such as a 4-pair cable, there is the possibility of potentially hazardous abnormal operating conditions that ideally are detected so that corrective action can be taken. In one case, there is a possibility for creation of a voltage within the powered device (PD) that may be at a potentially hazardous, abnormally high level. If certain types of short-circuit conditions exist within the interconnect (e.g. cables), the separate 48-volt output voltages of the PSEs may be combined or "stacked" to achieve a voltage on the order of 96 volts (the sum of both PSE voltages), which may be more hazardous than normal voltages appearing in the system. In another case, a cable may incorrectly have full operating voltage appearing on it under abnormal circumstances, for example when a cable is first plugged in to a PD and no detection/classification has yet taken place. This can be an indication that a PSE attached to the cable may be malfunctioning and creating a hazardous condition, i.e., providing full operating voltage when it should not be. It would be desirable to detect the presence of such conditions to avoid or minimize any hazardous operating conditions in a POE system.

Generally, a disclosed apparatus includes power circuitry connectible to a multi-conductor cable. The power circuitry transfers electrical power from a power-sourcing equipment (PSE) to a powered device (PD) over the multi-conductor cable. The power circuitry may reside in any of several locations, including within a PSE, within a PD, and along the connection between a PSE and PD. The power circuitry may be active circuitry such as a power source that provides POE power or a power converter that receives POE power, and/or passive circuitry such as a pass-through connections of an intermediate device that serve to complete connections between two cables, one to the PSE and one to the PD. The apparatus further includes hazard detection circuitry that senses an electrical characteristic of the multi-conductor cable and generates a detection signal indicating whether a potentially hazardous abnormal operating condition exists in the multi-conductor cable based on the sensed electrical characteristic. The sensed electrical characteristic may be a voltage or current for example, specifically a voltage or current that is not present under normal operating conditions. The detection signal also may take a variety of forms, with specific embodiments being described below.

In one specific aspect, the disclosed system includes at least two power-sourcing equipments (PSEs) that generate respective output power signals at respective powered communications interfaces, and a powered device (PD) having a powered communications interface at which the PD receives operating power. One or more multi-conductor cables connect the powered communications interfaces of the PSEs to the powered communications interface of the PD, the cables including at least two distinct sets of conductors each carrying a respective output power signal. The hazard detection circuitry includes short-circuit detection circuitry coupled to the cables to detect the presence of a hazard-producing short-circuit connection between the sets of conductors, wherein the hazard-producing short-circuit connection can cause a "stacking" or additive combining of the output voltages of the PSEs to generate a combined voltage at the PD greater than each of the output voltages of the PSEs. In one type of embodiment, the short-circuit detection circuitry includes voltage detection circuitry that detects an abnormally high voltage directly, whereas in other embodiments the circuitry includes current detection circuitry that detects abnormal return paths for classification current that is provided to one set of pairs, indicating the presence of the short-circuit condition. By employing the short-circuit detection circuitry, the hazard-producing short circuit condition can either be avoided or its duration can be minimized to reduce risk to circuit components and/or personnel.

In another aspect, the hazard detection circuitry includes hot-cable detection circuitry coupled to the cable which detects the presence of a power signal on the cable under conditions other than predetermined normal powered operating conditions. The hot-cable detection circuitry may reside either within the PSE or the PD. PSE-based circuitry may simply look for the presence of the full supply voltage on the cable when it is not being generated by the PSE, indicating that the voltage is abnormally present. PD-based circuitry can employ a variety of techniques, including measuring the rise-time of the supply voltage and discriminating between normal and abnormal rise-times; looking for a flag or marker that normally accompanies the turning-on of the supply voltage; and other techniques.

Description of Example Embodiments

Figure 1:
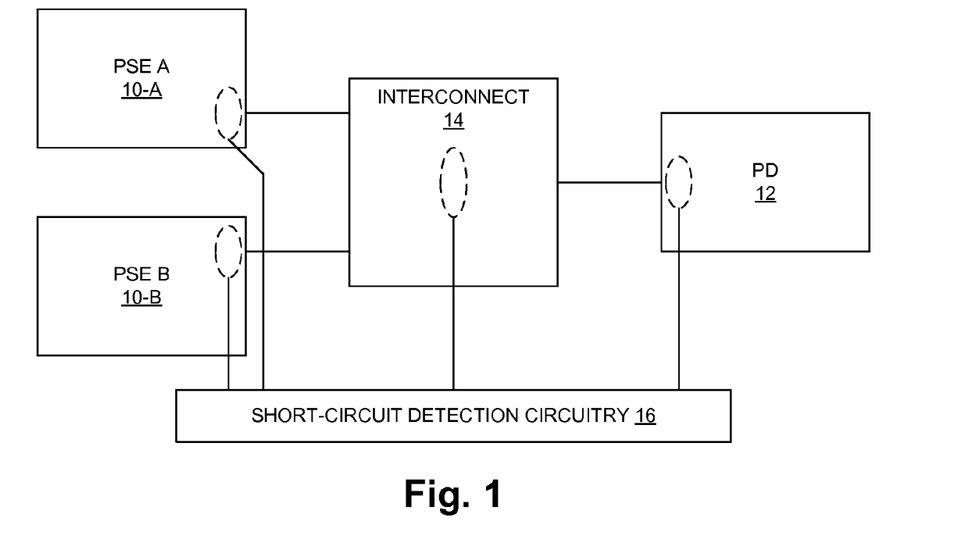
FIG. 1 is a block diagram of a power-over-Ethernet (POE) system.

FIG. 1 shows a general block-diagram depiction of a system according to one embodiment. Power-sourcing equipments (PSEs) 10-A and 10-B (shown as PSE A and PSE B respectively) are connected to a powered device (PD) 12 via interconnect 14, which generally includes one or more multi-conductor, twisted-pair cables and potentially other elements as well, as discussed below. Short-circuit detection circuitry 16 is connected into these elements at one or more locations, including within the interconnect 14, at either/both PSE 10-A and PSE 10-B, and at the PD 12. Several specific examples of short-circuit detection circuitry 16, its location as well as its connections are described below.

Generally, the short-circuit detection circuitry 16 detects the presence of a hazard-producing short-circuit connection between sets of conductors within the interconnect 14 which may cause additive combining of the output voltages of the PSEs 10 to generate a combined voltage at the PD 12 that is greater than each of the output voltages of the PSEs 10. For example, under applicable POE standards the output voltage produced by each PSE 10 is nominally 48 volts DC, and may be as high as 57 volts DC. These voltages are carried to the PD 12 on separate sets of conductors within the interconnect 14, and they may be used to power either separate loads or potentially a single load within the PD 12. In either case, the voltages are normally used only in parallel, such that under normal circumstances the highest voltage present within the PD 12 is nominally 48 volts. Under certain conditions, however (as described in more detail below), these voltages may become arranged in series within either the interconnect 14 or the PD 12 such that there exists an overall voltage that is equal to the sum of these voltages, which it will be appreciated may be as high as 114 volts DC. Such a high voltage may present an operating hazard, and the goal of the short-circuit detection circuitry 16 is to detect these hazardous conditions so that appropriate remedial action can be taken.

There are a variety of possible system-level configurations that are addressed by the present disclosure. The general configuration is illustrated in FIG. 1, but within this general organization there are several possible specific alternatives. One set of alternatives is based on whether the separate PSEs 10 (PSE a 10-A and PSE 10-B) are physically located together, such as in a network switch or similar piece of equipment. Some detection techniques are better suited to one arrangement or the other. There may be a so-called midspan power injector or "midspan" present between the PSEs 10 and the PD 12 (the injector would reside within the interconnect 14 in the organization of FIG. 1)—specific examples are shown below. Also, the PD 12 may use the power from separate PSEs 10 (and/or a midspan) to power separate loads, or a single load, and these alternatives can also have implications for the content and operation of the detection circuitry 16.

Figure 2:
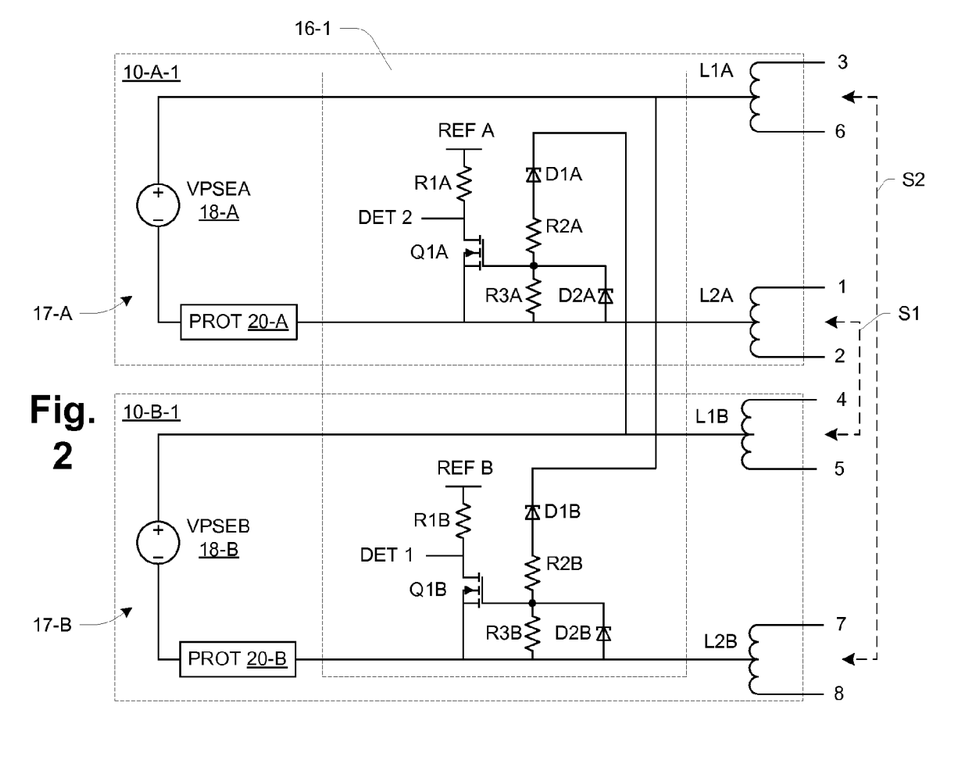
FIG. 2 is a schematic diagram of power-sourcing equipments (PSEs) in a POE system according to a first embodiment.

FIG. 2 shows an embodiment in which short-circuit detection circuitry 16-1 is included within a PSE A 10-A-1 and a PSE B 10-B-1. Each PSE 10 also includes power circuitry 17 (17-A, 17-B) in the form of a respective power source VPSEA 18-A, VPSEB 18-B; protection circuitry 20-A, 20-B; and inductors L1A, L2A, L1B and L2B that provide DC connections to conductors of a twisted-pair cable. Specifically, four conductor pairs are shown as (3,6), (1,2), (4,5) and (7,8). The inductors L1A, L2A, L1B and L2B in FIG. 2 represent the secondary side windings of transformers that are commonly used in POE systems. The AC-coupled primary (not shown) and secondary windings provide a path for high-speed data signals, while the center-tapped secondary also provides the DC connection to carry DC voltages and currents from the PSEs 10 to the PD 12.

On the far right in FIG. 2 are shown two potential short-circuits that can be detected by the detection circuitry 16-1. A first short shown as short S1 occurs between either conductor of pair 1,2 and a conductor of pair 4,5. A second short shown as S2 occurs between either conductor of pair 3,6 and a conductor of pair 7,8. It will be appreciated that in the event of short S1, the voltage appearing between pair 3,6 and pair 7,8 will be the sum of the voltages from VPSEA 18-A and VPSEB 18-B, and likewise this same summed voltage appears between pair 4,5 and pair 1,2 in the event of short S2.

The portion of circuitry 16-1 within PSE A 10-A-1 includes resistors R1A, R2A and R3A, zener diodes D1A and D2A, and transistor Q1A as shown. The resistor R1A is connected to a local DC operating voltage REF A. The top of diode D1A is connected to the positive rail of PSE B 10-B-1, at the same DC potential as pairs 4,5. Similar circuitry is shown within PSE B 10-B-1, with the top of diode D1B being connected to the positive rail of PSE A 10-A-1, at the same DC potential as pairs 3,6. The zener diodes D1A and D1B are selected to have a reverse breakdown voltage at a convenient value beyond the normal maximum output voltage of the corresponding source VPSEA 18-A or VPSEB 18-B while significantly less than the sum of these voltages. Depending on the application, a reverse breakdown voltage in the range of about 55 volts to about 70 volts may be appropriate.

Under normal operating circumstances, the transistors Q1A and Q1B do not conduct, and detection signals shown as DET 1 and DET 2 have voltages approximately equal to the reference voltages REF. In the event that short S1 occurs, the voltage at the top (cathode) of diode D1B begins rising toward approximately the sum of the voltages VPSEA and VPSEB. As soon as the voltage across diode D1B increases beyond its reverse breakdown voltage, the diode D1B begins conducting. The conduction of D1B creates drive voltage on the gate of transistor Q1B, causing it to begin conducting, which pulls the voltage of the detection signal DET 1 to approximately zero volts (tenths of a volt above the voltage at the drain of Q1B). In this state, the detection signal DET 1 is asserted and indicates that short S1 has been detected.

It will be appreciated that the portion of the detection circuitry 16-1 within PSE A 10-A-1 operates in a similar manner upon occurrence of short S2. In that case, the voltage at the top of diode D1A rises, and the circuitry operates in a similar manner as described above to pull the detection signal DET 2 to a low voltage asserted state indicating that S2 has been detected.

The detection signals DET 1 and DET 2 can be used to activate a mechanism for taking corrective action in response to the short-circuit condition. In an embodiment according to FIG. 2, for example, the PSE A 10-A-1 and PSE B 10-B-1 will typically have respective POE controllers (not shown) that can be notified when DET 1 or DET 2 becomes asserted, and may respond by shutting down power to the port for example (such as via the protection circuitry 20-A, 20-B). Other actions may be taken as well, such as notifying a system administrator or other responsible party, which may require the involvement of a higher-level controller forming part of the system housing the PSE A or PSE B. Specific examples of signaling that can be employed in response to detection of the short-circuit condition are shown below.

It should be noted that alternative embodiments may employ detection in only one of the PSEs 10, for any of a variety of reasons. Additionally, the specifics of the detection circuitry may vary in alternative embodiments. For example, it may be desirable to employ operational amplifiers or comparators along with threshold circuitry, in place of the arrangement employing Zener diodes etc. as shown in FIG. 2. A "short-circuit" need not be wire-type, zero-ohm short, it may have some non-zero resistance and may involve malfunctioning circuit components. From a circuit perspective, a short-circuit can be any condition that is sufficient to trigger the detection circuitry 16 (e.g., a sufficiently high voltage to cause diode D1A or D1B to conduct in FIG. 2). These aspects of a "short circuit" are generally true for different embodiments of the invention.

Finally, an arrangement like that of FIG. 2 may be generally applicable to an operating environment referred to in the POE standards as "environment B", which is characterized in that PSE A 10-A-1 and PSE B 10-B-1 are co-located and have a shared power connection. For example, the top rails of each supply VPSEA 18-A and VPSEB 18-B may be connected together. The detection circuitry 16-1 may also be employed when there is not such a shared connection, but it will be appreciated that it is necessary that the circuitry for a given PSE (e.g., the circuitry for PSE A 10-A-1 having the "A" suffix in FIG. 2) must have access to the power rail of the other PSE (e.g., of PSE B 10-B-1), and thus co-location is desirable. Circuits and techniques that are more suitable for environments in which power is being supplied from physically separate elements are described below.

Figure 3:
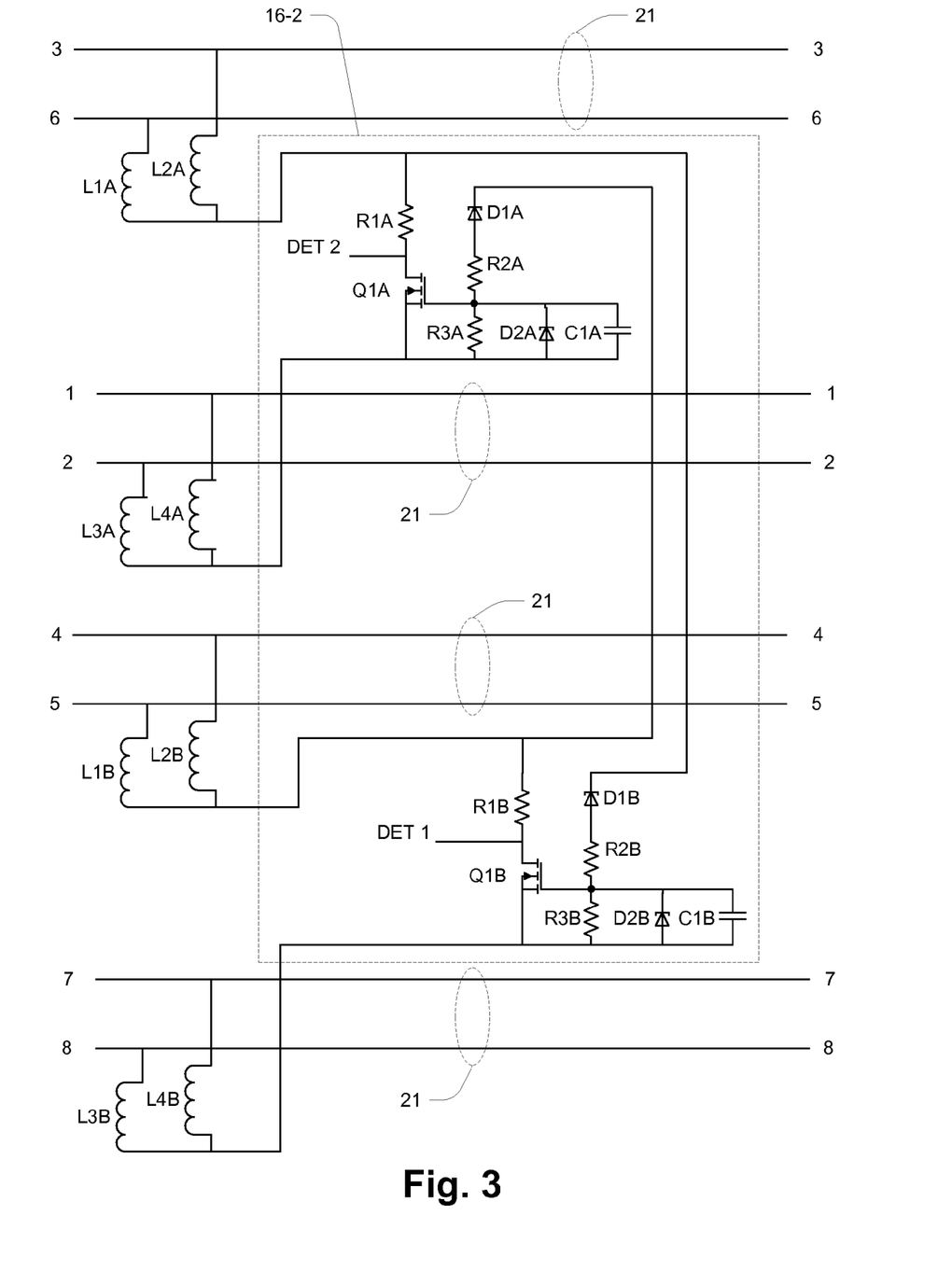
FIG. 3 is a schematic diagram of an intermediate device in a POE system according to a first embodiment.

FIG. 3 shows a second embodiment 16-2 of the detection circuitry 16. In this case, the circuitry 16-2 is suitable for use within the interconnect 14, such as in an intermediate device or "dongle" connected between the PSEs 10 and the PD 12 by respective multi-conductor cables. This arrangement may be useful when it is desired to add short-circuit detection to systems in which the PSEs 10 and PD 12 have not been designed for it.

The power circuitry in FIG. 3 takes the form of pass-through connections 21 between respective pairs (e.g., 3,6 etc.) of the cables to the PSE 10 and corresponding pairs of the cable to the PD 12. The circuitry 16-2 is generally similar to the circuitry 16-1 of FIG. 2. Some of the circuitry 16-1 may be integrated within the PSE controllers. Pairs of inductors (L1A,L2A), (L3A,L4A), (L1B,L2B) and (L3B,L4B) are connected to the twisted-pair conductors as shown to provide DC-only connections to the circuitry 16-2. These inductors are known as "auto-transformers" in the magnetic industry. The diode D1A in the upper circuitry has a connection to the pair 4,5, and similarly the diode D1B in the lower circuitry has a connection to the pair 3,6. Operation is similar to that of the circuitry 16-1 of FIG. 2. When a short occurs between pairs (1,2) and (4,5), diode D1B conducts and the detection signal DET 1 becomes asserted, and when a short occurs between pairs (3,6) and (7,8), diode D1A conducts and the detection signal DET 2 becomes asserted. These signals can be used to signal a separate mechanism for responding to the short-circuit condition. In some embodiments there may be local circuitry within the intermediate device itself that can break the connection to the PSEs 10 to prevent damage or injury, and may also signal either a local or remote user. Alternatively, the intermediate device may signal to one or both PSEs 10 and/or the PD 12. In the embodiment of FIG. 3, for example, if the resistors R1A, R2B and transistors Q1A and Q2B have appropriate values and sizes, the conduction of current by Q1A or Q1B may be sensed by protection circuitry within PSE A or PSE B as an over-current condition and cause the protection circuitry to shut down the flow of power from that PSE. It will be appreciated that this is a form of signaling. Such over-current protection circuitry may already be present in the PSEs 10 for general protection purposes, so this approach may reduce the circuitry dedicated to the pair-to-pair short-circuit detection and signaling functions.

The above-described signaling that can be effected by transistor Q1A can be viewed as "passive" in the sense that Q1A is conducting whenever the short S2 exists. It may be desirable to employ more active signaling. Active signaling control circuitry can be placed between the gate of transistor Q1A and the junction of resistors R2A and R2B and used to signal the short in a different manner than just passive DC conduction. For example, the signaling control circuitry can produce one or more current pulses to the PSE by causing Q1A to turn on and off in succession, which can serve to signal the detection of the short assuming that the PSE 10 has corresponding pulse detection circuitry. A protocol can be used to provide more specific information, such as an identification of the shorted pairs. This information can be encoded in the number, spacing or duration of pulses for example. Also special PHY-based identity networks may be introduced for such purposes, for example activating a clamp across one or more data pairs. At times, when 4-pair Ethernet is active, PHY based pair-pair short detection may be deployed. However, detecting common mode shorts at the center taps of data transformers would generally be a problem for PHY based detection and may be better tackled using POE based circuitry, because a fault may exist on the POE path but not on the data path.

Figure 4:
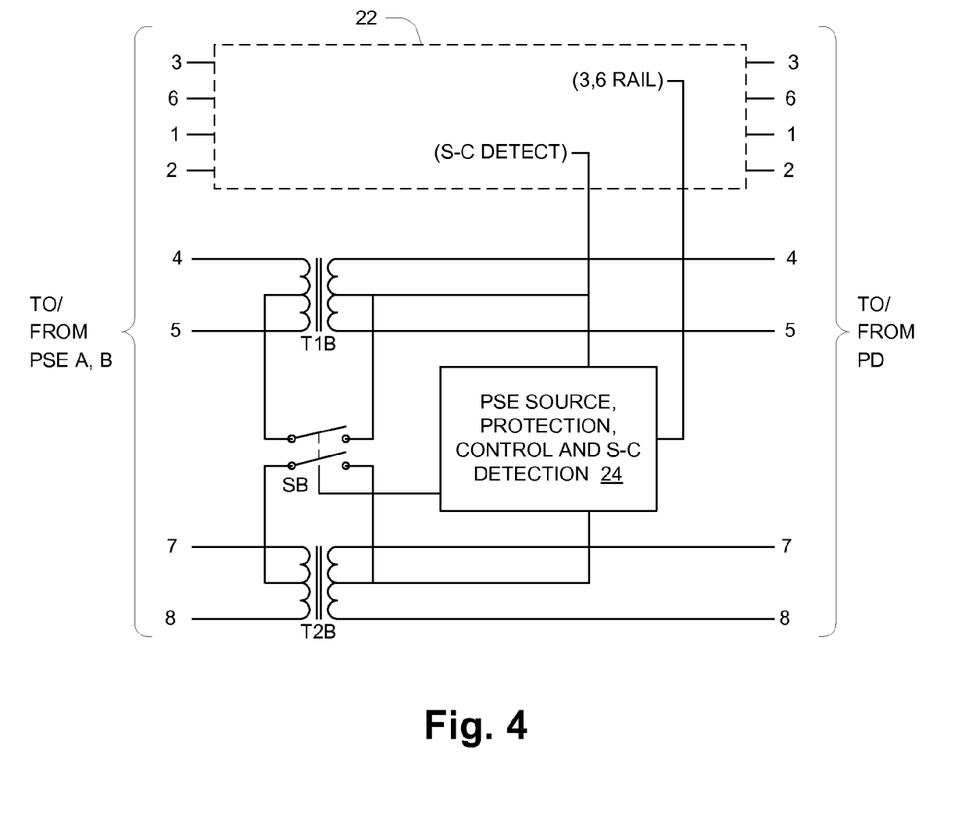
FIG. 4 is a schematic diagram of an intermediate device in a POE system according to a second embodiment.

FIG. 4 shows a third embodiment in which detection circuitry (not explicitly shown) is used within an intermediate device, in this case a midspan power injector or "midspan" forming part of the interconnect 14 between the PSEs 10 and PD 12. It is assumed that it is desired to inject power on only pairs 4,5 and 7,8, and thus the power circuitry includes a circuit block 22 that effects a DC pass-through of pairs 3,6 and 1,2. The circuit block 22 may also include A-side short-circuit detection circuitry (SC-DETECT), such as the circuitry shown in FIG. 3 for example. Such short-circuit detection circuitry will have a connection to the 4,5 pair, e.g., via the secondary center tap of transformer T1B as shown.

The "B" side circuitry includes transformers T1B and T2B, a double-pole, single-throw switch SB, and circuitry 24 that includes a PSE power source and protection circuitry coupled to pairs 4,5 and 7,8 to provide POE power thereto. The circuitry 24 also includes control circuitry as well as short-circuit detection (S-C DETECTION) circuitry such as circuitry of the type shown in FIG. 3, and this circuitry has a connection to pair (3,6) to sense the over-voltage condition arising from short S1.

In operation, the control circuitry within circuitry 24 maintains the switch SB in the open position as shown, providing DC isolation between the primary and secondary sides of the transformers T1B and T2B. This enables the circuitry 24 to provide POE power to the PD 12 via pairs 4,5 and 7,8. When the short S1 condition is detected by the short-circuit detection circuitry within circuitry 24, the controller generates a detection signal by temporarily closing the switch SB to complete a DC connection between the PSE B and pairs 4,5 and 7,8. Assuming that the PSE B 10-B includes its own short-circuit detection circuitry, then when the connections are made by switch SB the detection circuitry of PSE B 10-B can also detect the short circuit. Other means of communications between the midspan and PSE B may exist, such as a dedicated Ethernet connection or appropriate signaling that would be presented to PSE B in the form of an identity network, signaling a fault, and eliminating the need for the switch SB.

Figure 5:
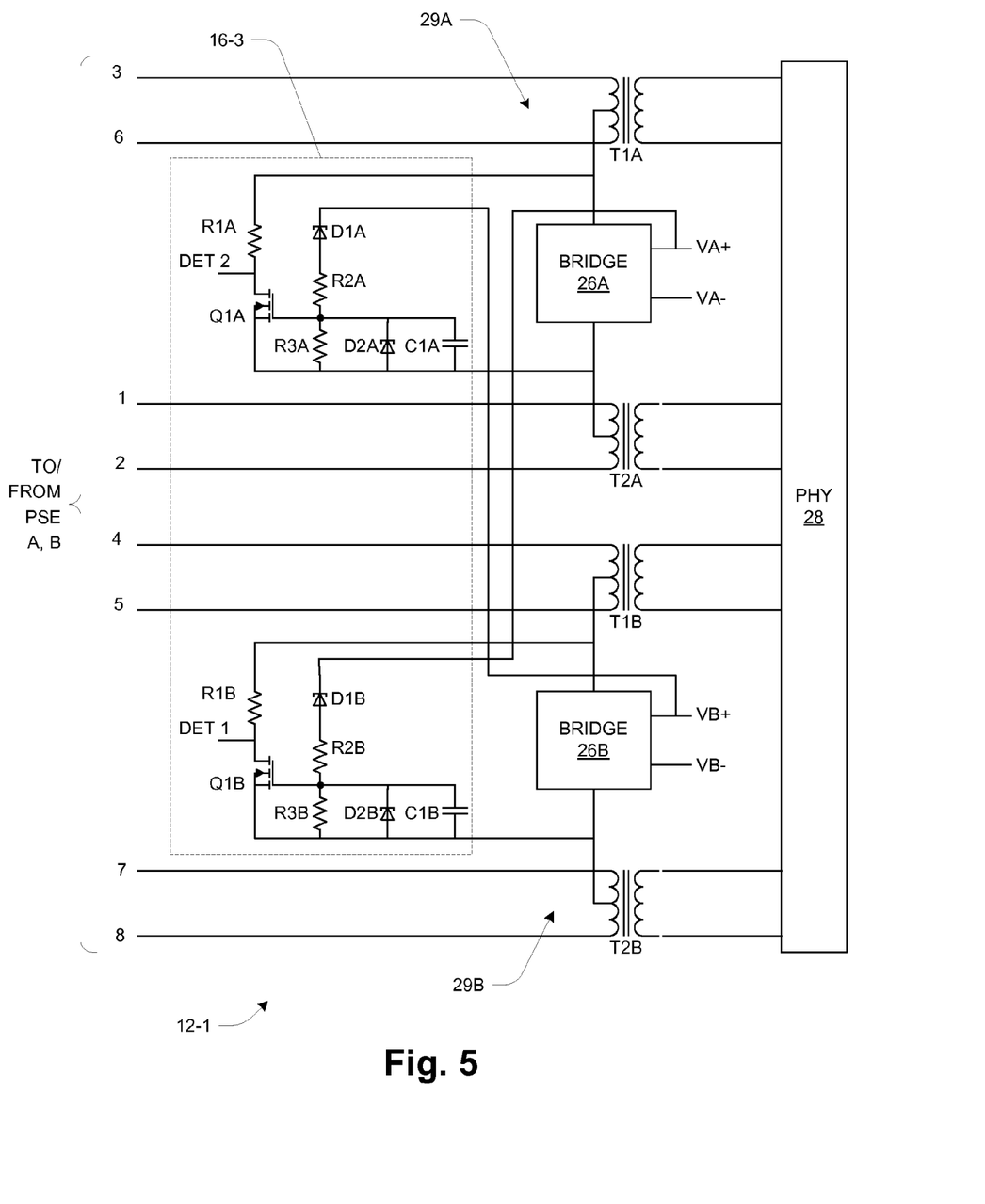
FIG. 5 is a schematic diagram of a powered device (PD) in a POE system.

FIG. 5 shows an embodiment of a PD 12-1 which includes detection circuitry 16-3 as well as normal PD operating circuitry including isolating transformers T1A, T1B, T2A, T2B, full bridge protection circuitry (BRIDGE) 26A, 26B, and physical-layer circuitry (PHY) 28. The transformers and full bridge protection circuitry 26 constitute power circuitry 29 (29A, 29B) of the PD 12. A diode D1A has a connection to the B-side output voltage VB+, and likewise diode D1B has a connection to the A-side output voltage VA+. It will be appreciated that this arrangement is slightly different than for the circuits 16-1 and 16-2, in which the diodes D1A and D1B are connected to pairs 4,5 and 3,6 respectively. However, overall operation is similar to that of the circuitry 16-1 or 16-2, as described above.

In the embodiments of FIGS. 2-5 above, the short-circuit detection circuitry 16 can be viewed as voltage detection circuitry, as it operates to detect an abnormally high operating voltage which can be caused by certain short-circuit conditions (e.g., S1 or S2) in the interconnect 14, or anywhere along the power signal path from the source to the load. An alternative general approach is to detect such a short-circuit condition more directly, which in some embodiments may employ current (rather than voltage) detection circuitry. Specific examples of such embodiments are described below.

Figure 6:
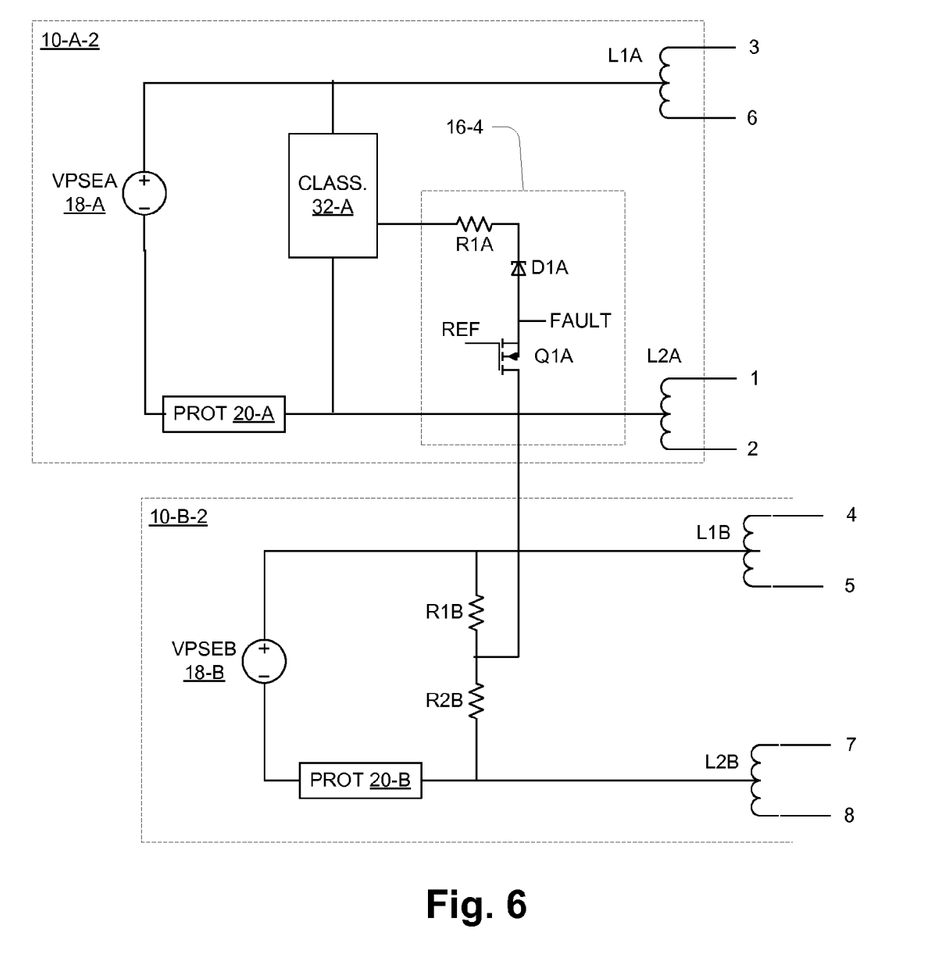
FIG. 6 is a schematic diagram of power-sourcing equipments (PSEs) in a POE system according to a second embodiment.

FIG. 6 shows an embodiment using a current-based approach to detecting the potentially hazardous short-circuit condition. PSE A 10-A-2 includes a detection circuit 16-4 with connections to pairs 4,5 and 7,8 of PSE B 10-B-2 through resistors R1B and R2B. Rather than sensing an abnormally high operating voltage as do the circuits 16-1, 16-2 and 16-3, the detection circuit 16-4 operates in connection with classification circuitry 32-A to detect whether classification current is improperly being diverted to another pair, which can be caused by short S1 or short S2. That is, under normal operating conditions a normal classification current flows only between two specific pairs (e.g. pair 1,2 and pair 3,6), whereas under certain short-circuit conditions an improper current may flow between two pairs (e.g., pair 1,2 and pair 4,5 or pair 7,8). This approach has the benefit that the short-circuit is detected before full operating power is supplied by the PSEs 10, thus potentially completely avoiding any operation at hazardous voltages. Similar detection methods may be used during the detection of the 25 k signature. Once power is fully on, other mechanisms would be needed to monitor for the sudden occurrence of a short condition as discussed earlier.

In particular, the detection circuitry 16-4 includes a resistor R1A, a diode D1A and a transistor Q1A as shown, with the gate of transistor Q1A connected to a reference voltage REF and its drain connected to both pairs 4,5 and 7,8 via respective resistors R1B, R2B. The upper end of resistor R1A is connected into the A-side classification circuitry 32-A. As generally known in the art, the classification circuitry 32-A operates before the application of full POE power to pairs 3,6 and 1,2 (i.e., protection circuitry 20-A is OFF).

During operation, the classification circuitry 32-A applies a classification voltage of 15-20 volts DC across pairs 3,6 and 1,2, and the resulting DC current conducted on this circuit by the PD is measured. Normally, such current flows in one direction down pair 3,6, through the PD, and back to the classification circuitry via pair 1,2. In this normal operating condition, no current flows through the detection circuitry 16-4, and the signal FAULT has a first relatively high voltage indicating that no fault is present.

In the event of either short S1 or S2, at least some of the classification current is diverted along a path through a corresponding one of the resistors R1B or R2B, the detection circuitry 16-4, and back into the classification circuitry 32-A via resistor R1A. This flow of current pulls down the voltage of the detection signal FAULT, indicating that the short-circuit condition has been detected.

Figure 7:
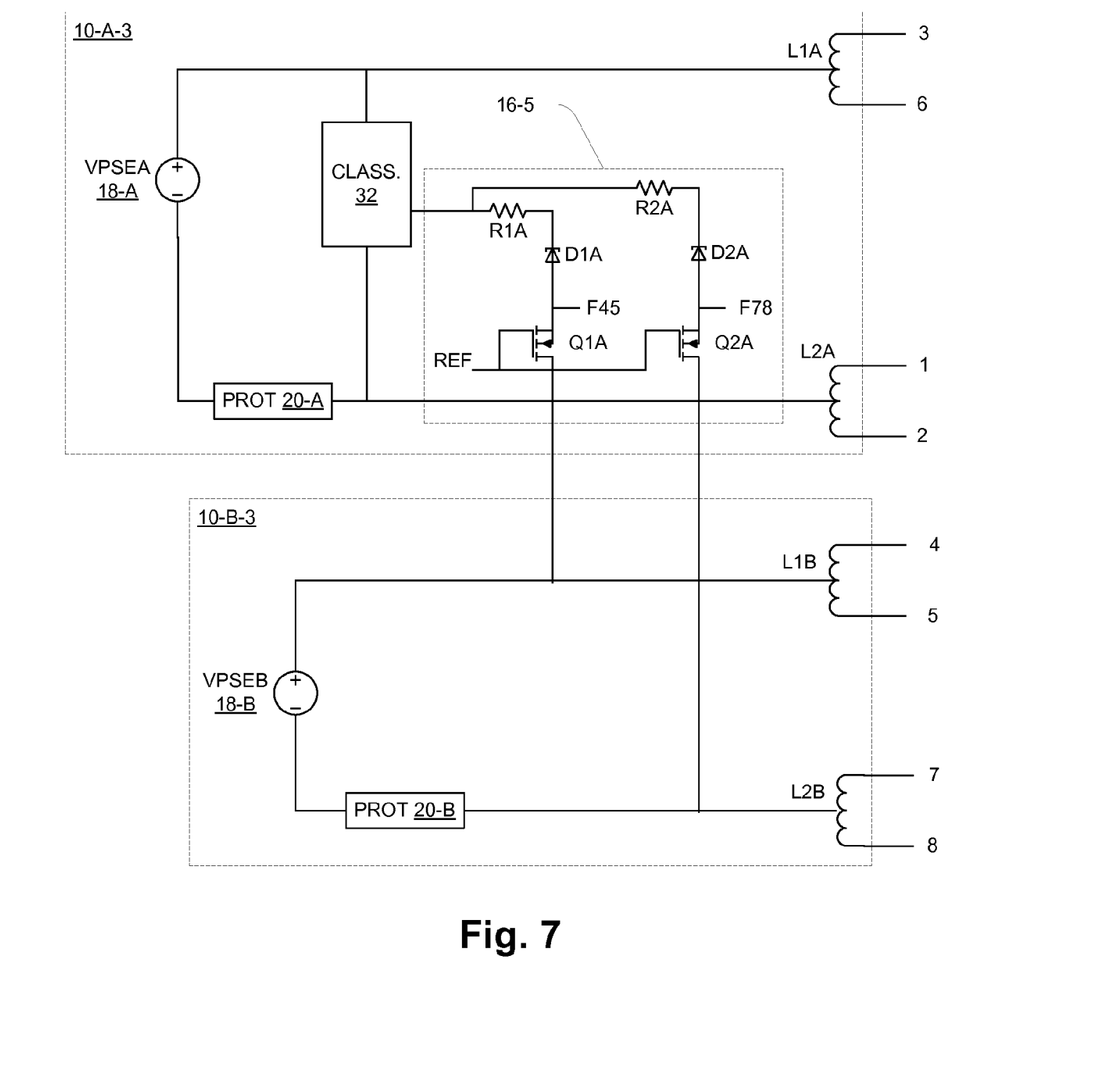
FIG. 7 is a schematic diagram of power-sourcing equipments (PSEs) in a POE system according to a third embodiment.

FIG. 7 shows an arrangement similar to that of FIG. 6, but in this case the detection circuitry 16-5 has separate current detection sub-circuits with corresponding connections to the pairs 4,5 and 7,8 respectively. This configuration provides the advantage of greater fault identification. A first detection signal F45 from the sub-circuit including resistor R1A, diode D1A and transistor Q1A indicates a short to pair 4,5, and a second detection signal F78 from the sub-circuit including resistor R2A, diode D2A and transistor Q1A indicates a short to pair 7,8.

It should be noted that the circuit of FIG. 7 can detect both the short S1 ((1,2) shorted to (4,5)) and short S2 ((3,6) shorted to (7,8)) conditions when the PD 12 powers separate loads from PSE A 10-A-3 and PSE B 10-B-3. When the PD 12 powers a single load using power from both PSEs, however, then a single circuit such as the detection circuit 16-5 may detect short S2 but not S1. In such a case, it may be desirable to employ additional and/or alternative circuitry to detect short S2. One such alternative is to use circuitry like the circuitry 16-5 in PSE B 10-B-3 as well. The additional circuitry can detect short S2.

It should also be noted that the arrangements shown in FIGS. 6-7 can work when the PSEs 10-A-3 and 10-B-3 are arranged in either the "environment A" or "environment B" manner.

Figure 8:
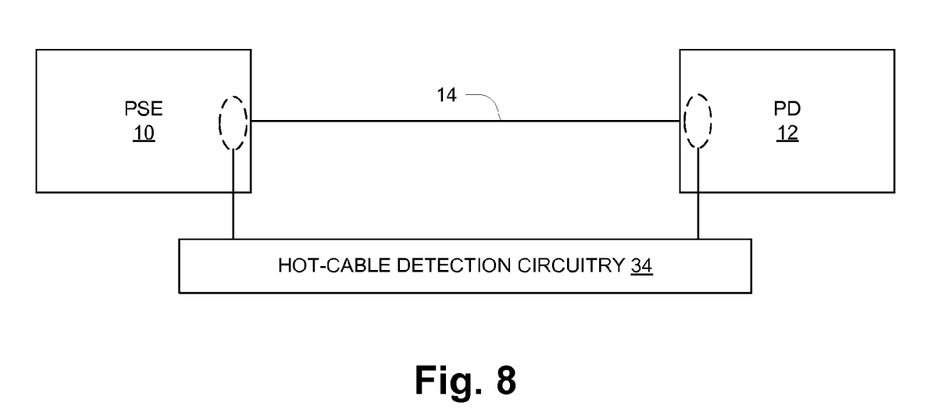
FIG. 8 is a block diagram of a POE system.

FIG. 8 is a high-level depiction of another aspect of the disclosed hazard detection circuitry, which is hot-cable detection circuitry 34 residing in either the PSE 10 or PD 12 and coupled to the cable 14. The hot-cable detection circuitry 34 is used to detect the presence of the full supply voltage Vsupp (48 volts DC) on the cable 14 under conditions other than normal powered operating conditions, thus identifying another potentially hazardous operating condition so that corrective action can be taken. This kind of hazardous operating condition might occur, for example, if a fault develops in the PSE 10 such that it supplies the full supply voltage without first executing proper PD detection or fails to disconnect the full supply voltage when the cable 14 is disconnected from one PD and plugged into another one. There may be any of a variety of specific causes of such fault conditions.

Figure 9:
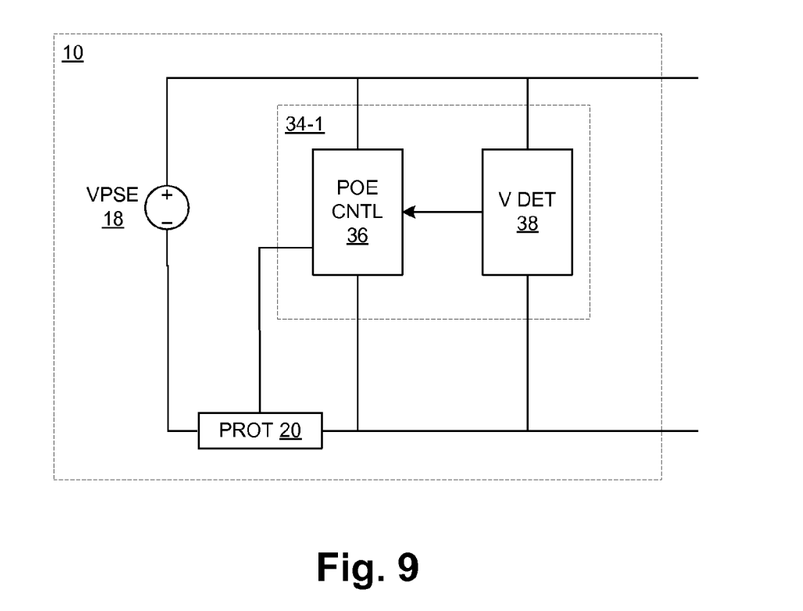
FIG. 9 is a schematic diagram of a PSE in a POE system according to a fourth embodiment.

FIG. 9 shows first hot-cable detection circuitry 34-1 residing in a PSE 10. This circuitry may be used to detect the presence of the supply voltage on the cable 14 when it is not being supplied by this PSE 10, a situation that can occur, for example, if a cable 14 from another PSE is connected to this PSE 10. Sometimes this kind of connection might be in error, as a PSE is normally only connected to a PD. In some cases, though, such a PSE-PSE connection might be used for desired functional purposes involving PHY-based communications between the two PSEs (but not any use of POE power).

The hot-cable detection circuitry 34-1 includes a POE controller (POE CNTL) 36 as well as voltage detection circuitry (VDET) 38. The voltage detection circuitry 38 is configured to assert an output signal to the POE controller 36 when a voltage on the cable 14 exceeds a threshold voltage, whose value may be a certain fraction of the full supply voltage depending on the specific design of the system. For example, a threshold voltage of 30 to 40 volts may be used. The POE controller 36 is aware of whether or not the PSE 10 is currently providing the supply voltage to the cable 14, based on the status of the voltage source 18 and whether the protection circuitry 20 is ON (connecting the voltage source 18 to the cable 14) or OFF (isolating the voltage source 18 from the cable 14). When a voltage is detected on the cable 14 as reported by the voltage detection circuitry 38, and the PSE 10 is not the source of this cable voltage as reflected in the status of the voltage source 18 and/or the protection circuitry 20, the POE controller 36 can interpret this circumstance as a potentially hazardous condition and either take action itself or generate signaling to notify a higher-level controller which might take action. Local action could include, for example, preventing any turning-on of the protection circuitry 20 to ensure that the voltage source 18 does not become connected to the hot cable 14. It is also worth noting that at times the interconnect may have a fault that causes a hot cable due to a mis-configuration resulting from the coupling of a third powered device (hot cable) into the interconnect of the 2 PSEs where the hot detection in underway.

It is noted that the POE controller 36 may be in the operating mode of performing PD detection and thus itself applying a detection/classification voltage to the cable 14. In this case, the POE controller 36 preferably employs a "back-off" algorithm to periodically stop performing detection and instead listen to the output from the voltage detection circuit 38. At times a crossover cable is used for cable 14, and under such conditions the voltage detection circuitry 38 may see about 0.7 v, because a cross over cable exchanges pairs 1,2 and 3,6 of the remote PSE causing the positive terminal of the remote—hot PSE to connect to the negative terminal of the local PSE. This introduces a bias for the diode of the protection device across the voltage detection circuitry 38 called for in the 802.3af standard. Also, the voltage detection circuitry 38 may be within the controller 36.

While the above presents the detection of a hot cable during detection or classification, it may be desirable to perform hot-cable detection during normal operation of the data link. In this case, when the data link is operating, the PSE 10 can back off and search for a potential fault.

Figure 10:
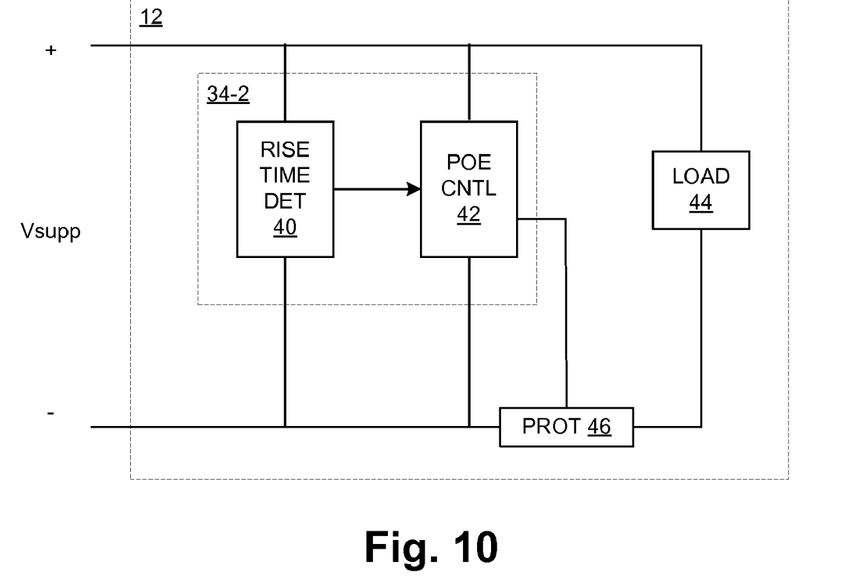
FIG. 10 is a block diagram of a PD in a POE system according to a second embodiment.

FIG. 10 shows second hot-cable detection circuitry 34-2 residing in the PD 12. This circuitry may be used to detect the presence of the supply voltage on the cable 14 when being supplied by the attached PSE 10, a more usual condition than that described above.

The second hot-cable detection circuitry 34-2 includes rise time detection circuitry 40 and a PD POE controller (POE CNTL) 42. Also shown as included within the PD 12 are a load 44 and protection circuitry 46. This circuitry operates based on distinguishing between a normal rise time and an abnormal rise time of the supply voltage Vsupp on the cable 14, as described in more detail below. In normal operation, when a PSE 10 applies the full supply voltage Vsupp to the cable 14, the cable voltage rises over a certain period, due to a variety of circuit characteristics including the turn-on characteristics of the PSE protection circuitry 20 (FIG. 9). In contrast, if a cable 14 that already has the full supply voltage on it is suddenly plugged into a PD 12, the cable voltage as detected at the PD 12 will rise much more sharply. This difference in the rise-time characteristics can be exploited to distinguish the abnormal hot-cable condition from the normal condition.

Figure 11:
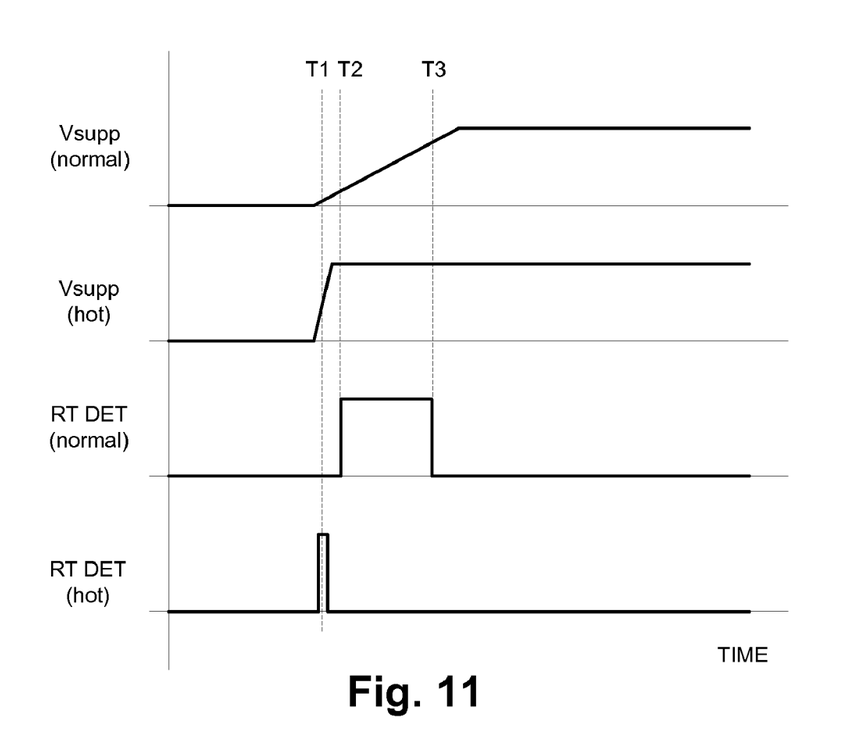
FIG. 11 is a waveform diagram depicting operation of the PD of FIG. 10.

Referring to FIG. 11, the normal rise-time for the supply voltage Vsupp on the cable 14 is shown in the waveform Vsupp (normal). As shown, this voltage starts rising at time T1 and it rises over a period from time T2 to time T3, these times corresponding to predetermined voltage values (for example, 10 volts and 30 volts respectively). The output from the rise-time detection circuitry 40 (shown as RT DET (normal)) is asserted during this rise-time interval. The time scale can vary, but a typical duration of the interval between T2 and T3 may be tens of microseconds to tens of milliseconds for example (function of input capacitance and inrush circuitry present). The POE controller 42 employs a counter or other circuit to measure the duration of the asserted output from the rise-time detection circuitry 40, and assuming that the measured duration falls within some established limits, the POE controller 42 can conclude that the supply voltage is being supplied in the normal fashion.

FIG. 11 also shows an example of an abnormal rise-time (shown as Vsupp(hot)). In this case, the voltage Vsupp rises very quickly just after time T1, and output RT-DET(hot) from the rise-time detection circuitry 40 is correspondingly shifted and shortened in duration. In this case, the POE controller 42 measures a much shorter interval of assertion of the output, and can conclude that the abnormal or "hot-cable" condition exists, and take appropriate action (which may be similar to that described above for the PSE controller 36).

In the above example, threshold voltages of 10 and 30 volts are employed. Regarding the lower value, it will be appreciated that a low voltage somewhat above zero volts may be generally desirable to reduce noise. The upper value may be selected to avoid effects that can occur as the supply voltage approaches its nominal operating value of 48 volts, including the charging of filter capacitors, conducting of load current, etc. which might distort the rise-time measurement. The specific value of 30 volts corresponds to the so-called under-voltage lockout threshold in the POE specifications. It will be appreciated that in alternative embodiments these threshold voltages may have different specific values.

Another general approach that can be employed by a PD 12 is to detect the absence of a marker or flag that normally accompanies the supplying of the full supply voltage on the cable 14, such absence indicating that the presence of the supply voltage may be due to abnormal conditions. One such marker already used in POE systems is the detection/classification operation that normally precedes the supplying of the full supply voltage. In this case, the PD 12 may employ a timer which is triggered whenever detection/classification occurs. The value of the timer may be on the order of one second or less for example. When the PD 12 detects the presence of the full supply voltage and the timer has not expired, then it can conclude that normal operating conditions are present. If the timer has expired, however, then this may be an indication that the full supply voltage is present due to some abnormal operating condition that results in power being supplied when it should not be, and then take appropriate action such as discussed above. In alternative embodiments, a more explicit flag may be used in the signaling from the PSE 10 to indicate that power is about to be supplied, and the PD 12 checks for the occurrence of this flag to validate the presence of the supply voltage. This explicit flag may take the form of a modulation of the detection/classification voltages used by the PSE 10, or specific additional signaling voltages presented on the cable 14 after detection/classification is complete. Alternatively, the PSE 10 could manipulate the rise time of the 48 volts itself by controlling the operation of the protection circuitry 20. For example, the PSE 10 could bring the voltage up to 24 volts, pause for some predetermined time, and then bring it the rest of the way up to 48 volts. The PD 12 can employ circuitry to detect the presence or absence of this rise-time characteristic.

As a variation on the above approach, the PD 12 may itself signal to the PSE 10 in some manner indicating that the PSE 10 should provide power, and if the PD 12 detects the presence of the supply voltage on the cable 14 when the PD 12 has not provided such a signal, the PD 12 can infer that abnormal operating conditions may be present. This signaling may take the form, for example, of specific currents conducted by the PD 12 in response to signaling voltages applied to the cable 14 by the PSE 10.

While various embodiments of the invention have been particularly shown and described, it will be understood by those skilled in the art that various changes in form and details may be made therein without departing from the spirit and scope of the invention as defined by the appended claims.

What is claimed is:

1. Apparatus, comprising:
    power circuitry connectible to a multi-conductor cable, the power circuitry being operative to transfer electrical power from a power-sourcing equipment (PSE) to a powered device (PD) over the multi-conductor cable; and
    hazard detection circuitry connectible to the multi-conductor cable, the hazard detection circuitry being operative to sense an electrical characteristic of the multi-conductor cable and generate a detection signal indicating whether a potentially hazardous abnormal operating condition exists in the multi-conductor cable based on the sensed electrical characteristic, wherein:
    the PSE is one of a plurality of PSEs operative to generate respective output power signals at respective powered communications interfaces, the output power signals including respective output voltages;
    the multi-conductor cable is one of one or more multi-conductor cables connecting the powered communications interfaces of the PSEs to a powered communications interface of the PD, the cables including at least two distinct sets of conductors, each set of conductors carrying a respective one of the output power signals; and
    the hazard detection circuitry comprises short-circuit detection circuitry coupled to the cables, the short-circuit detection circuitry being operative to detect the presence of a hazard-producing short-circuit connection between the sets of conductors, the hazard-producing short-circuit connection causing additive combining of the output voltages of the PSEs to generate a combined voltage at the PD greater than each of the output voltages of the PSEs.

2. Apparatus according to claim 1 wherein the short-circuit detection circuitry includes voltage detection circuitry operative to detect a voltage between the sets of conductors that is greater than each of respective voltages appearing on the sets of conductors.

3. Apparatus according to claim 2 wherein the voltage detected by the voltage detection circuitry is greater than a maximum operating value of each of the respective output voltages of the PSEs.

4. Apparatus according to claim 3 wherein the voltage detection circuitry includes a reverse-breakdown diode connected across the sets of conductors and having a reverse-breakdown voltage sufficient to enable the reverse-breakdown diode to conduct reverse current only when the voltage across the sets of conductors exceeds a voltage greater than the maximum operating value of each of the respective output voltages of the PSEs.

5. Apparatus according to claim 1 wherein the short-circuit detection circuitry includes current detection circuitry configured to detect an improper flow of current between the sets of conductors, the improper current flow being absent during normal operation but present when the potentially hazardous abnormal operating condition exists.

6. Apparatus according to claim 5 wherein the short-circuit detection circuitry is operative when the output power signals are not being supplied by the PSEs.

7. Apparatus according to claim 6 wherein the short-circuit detection circuitry is operative during a PD detection and classification operation that precedes the supplying of the output power signals from the PSEs.

8. Apparatus according to claim 5 wherein the current detection circuitry is connectible to multiple conductor pairs of one of the sets of conductors so as to detect the improper current flow into any of the conductor pairs of the one set of conductors.

9. Apparatus according to claim 5 wherein the current detection circuitry includes a plurality of current detection sub-circuits each connectible to a corresponding conductor pair of one of the sets of conductors so that each current detection sub-circuit detects the improper current flow into only the corresponding conductor pair of the one set of conductors.

10. Apparatus according to claim 1 wherein the short-circuit detection circuitry includes signaling circuitry operative to signal the detection of the hazard-producing short-circuit condition to at least one of the PSEs.

11. Apparatus according to claim 10 wherein the signaling circuitry is operative to generate a single-pair short circuit visible to the at least one PSE.

12. Apparatus according to claim 10 wherein the signaling circuitry includes passive circuitry such that the single-pair short circuit is present whenever the hazard-producing short-circuit condition is present.

13. Apparatus according to claim 10 wherein the signaling circuitry includes active circuitry such that the single-pair short circuit is sent in a pulsed manner conveying additional information when the hazard-producing short-circuit condition is detected.

14. Apparatus according to claim 1 wherein the short-circuit detection circuitry is located at the PD.

15. Apparatus according to claim 1 wherein the short-circuit detection circuitry includes:
   a first circuit operative to detect a first short-circuit condition between first conductor pairs of the sets of conductors; and
   a second circuit operative to detect a second short-circuit condition between second conductor pairs of the sets of conductors, the second conductor pairs being distinct from the first conductor pairs.

16. Apparatus according to claim 1 wherein the short-circuit detection circuitry is located within at least one of the PSEs.

17. Apparatus according to claim 16 wherein the PSEs are arranged to have one shared power connection.

18. Apparatus according to claim 1 wherein the short-circuit detection circuitry is located within an intermediate device coupled between the PSEs and the PD.

19. Apparatus according to claim 18 wherein the intermediate device is a mid-span power injector.

20. Apparatus according to claim 18 wherein the mid-span power injector includes:
   locally controlled switches operative to selectively make or break a DC connection between one of the PSEs and the PD; and
   a controller operative (i) in a normal operating condition, to maintain the switches in an open position so as to establish DC isolation between the one PSE and the PD, and (ii) upon detection of the short-circuit condition, to temporarily move the switches to a closed position to enable the one PSE to detect the existence of the short-circuit condition.

21. Apparatus according to claim 1 wherein:
   the PSE is operative to generate an output power signal at the powered communications interface under predetermined normal powered operating conditions; and
   the hazard detection circuitry comprises hot-cable detection circuitry connectible to the multi-conductor cable, the hot-cable detection circuitry being operative to detect the presence of a power signal on the multi-conductor cable under conditions other than the predetermined normal powered operating conditions.

22. Apparatus according to claim 21 wherein the hot-cable detection circuitry resides in the PSE and includes (1) voltage detection circuitry operative to generate a detection signal indicating the presence of the power signal on the cable, and (2) a controller operative (a) to control the generating of the output power signal at the powered communications interface of the PSE, and (b) to detect assertion of the detection signal from the voltage detection circuitry when the PSE is not generating the output power signal at the powered communications interface of the PSE.

23. Apparatus according to claim 22 wherein the hot-cable detection circuitry resides in the PD and includes (1) rise-time detection circuitry operative to detect a rise time of the power signal on the cable, and (2) a controller operative to discriminate between a first rise time of the power signal under the normal predetermined powered operating conditions and a second distinct rise time of the power signal under other than the normal predetermined powered operating conditions.

24. Apparatus according to claim 22 wherein the hot-cable detection circuitry resides in the PD and includes circuitry operative to detect a flag or marker in signaling from the PSE that accompanies the generating of the output power signal under the normal powered operating conditions.

25. Apparatus according to claim 24 wherein the flag or marker comprises a predetermined maximum time since a preceding detection/classification operation.

26. Apparatus according to claim 24 wherein the flag or marker comprises an explicit electrical signal generated by the PSE.

27. Apparatus according to claim 22 wherein the hot-cable detection circuitry resides in the PD and includes circuitry operative (1) to generate a signal to the PSE indicating that the output power signal should be generated, and (2) to detect the presence of the power signal on the cable when the signal has not been generated.

28. Apparatus according to claim 1 wherein:
   the power circuitry and hazard detection circuitry reside within the PSE; and
   the power circuitry includes a power source operative to generate the electrical power to be transferred to the PD.

29. Apparatus according to claim 1 wherein:
   the power circuitry and hazard detection circuitry reside within the PD; and
   the power circuitry includes a power converter operative to receive the electrical power to be received from the PSE.

30. Apparatus according to claim 1 wherein:
   the power circuitry and hazard detection circuitry reside within an intermediate device to be located between the PSE and the PD;
   the multi-conductor cable is one of a pair of multi-conductor cables connectible to the intermediate device, one of the pair for connecting the PSE to the intermediate device and the other of the pair for connecting the intermediate device to the PD; and
   the power circuitry comprises a set of conductors operative to provide connections between the multi-conductor cables when the multi-conductor cables are connected to the intermediate device.

31. A method, comprising:
   transferring electrical power from a power-sourcing equipment (PSE) to a powered device (PD) over a multi-conductor cable; and
   as part of the process of transferring electrical power from the PSE to the PD over the multi-conductor cable, (1) sensing an electrical characteristic of the multi-conductor cable, and (2) generating a detection signal indicating whether a potentially hazardous abnormal operating condition exists in the multi-conductor cable based on the sensed electrical characteristic,
   wherein:
      the PSE is one of a plurality of PSEs operative to generate respective output power signals at respective powered communications interfaces, the output power signals including respective output voltages;
      the multi-conductor cable is one of one or more multi-conductor cables connecting the powered communications interfaces of the PSEs to a powered communications interface of the PD, the cables including at least two distinct sets of conductors, each set of conductors carrying a respective one of the output power signals; and sensing the electrical characteristic of the multi-conductor cable includes detecting the presence of a hazard-producing short-circuit connection between the sets of conductors, the hazard-producing short-circuit connection causing additive combining of the output voltages of the PSEs to generate a combined voltage at the PD greater than each of the output voltages of the PSEs.

32. A method according to claim 31, further including detecting a voltage between the sets of conductors that is greater than each of respective voltages appearing on the sets of conductors.

33. A method according to claim 31, further including detecting an improper flow of current between the sets of conductors, the improper current flow being absent during normal operation but present when the potentially hazardous abnormal operating condition exists.

34. A method according to claim 33, wherein the detecting is performed when the output power signals are not being supplied by the PSEs.

35. A method according to claim 34, wherein the detecting is performed during a PD detection and classification operation that precedes the supplying of the output power signals from the PSEs.

36. A method according to claim 31, further including signaling the detection of the hazard-producing short-circuit condition to at least one of the PSEs.

37. A method according to claim 36, wherein the signaling includes generating a single-pair short circuit visible to the at least one PSE.

38. A method according to claim 37, wherein the signaling includes making the single-pair short circuit present whenever the hazard-producing short-circuit condition is present.

39. A method according to claim 37, wherein the signaling includes sending the single-pair short circuit in a pulsed manner conveying additional information when the hazard-producing short-circuit condition is detected.

40. A method according to claim 31, further including, in an intermediate device coupled between the PSEs and the PD:
    selectively making or breaking a DC connection between one of the PSEs and the PD; and
    (i) in a normal operating condition, maintaining the switches in an open position so as to establish DC isolation between the one PSE and the PD, and (ii) upon detecting the short-circuit condition, temporarily moving the switches to a closed position to enable the one PSE to detect the existence of the short-circuit condition.

41. A method according to claim 31, further including:
    generating an output power signal at the powered communications interface of the PSE under predetermined normal powered operating conditions; and
    detecting the presence of a power signal on the multi-conductor cable under conditions other than the predetermined normal powered operating conditions.

42. A method according to claim 41, further including (1) generating a detection signal indicating the presence of the power signal on the cable, and (2) (a) controlling the generating of the output power signal at the powered communications interface of the PSE, and (b) detecting assertion of the detection signal from the voltage detection circuitry when the PSE is not generating the output power signal at the powered communications interface of the PSE.

43. A method according to claim 41 further including (1) detecting a rise time of the power signal on the cable, and (2) discriminating between a first rise time of the power signal under the normal predetermined powered operating conditions and a second distinct rise time of the power signal under other than the normal predetermined powered operating conditions.

44. A method according to claim 41 further including detecting a flag or marker in signaling from the PSE that accompanies the generating of the output power signal under the normal powered operating conditions.

45. A method according to claim 44 wherein the flag or marker comprises a predetermined maximum time since a preceding detection/classification operation.

46. A method according to claim 44, wherein the flag or marker comprises an explicit electrical signal generated by the PSE.

47. A method according to claim 41, further including (1) generating a signal to the PSE indicating that the output power signal should be generated, and (2) detecting the presence of the power signal on the cable when the signal has not been generated.

* * * * *